(12) United States Patent
Tourné et al.

(10) Patent No.: US 6,581,202 B1
(45) Date of Patent: Jun. 17, 2003

(54) SYSTEM AND METHOD FOR MONITORING AND IMPROVING DIMENSIONAL STABILITY AND REGISTRATION ACCURACY OF MULTI-LAYER PCB MANUFACTURE

(75) Inventors: Joseph A. A. M. Tourné, Helmond (NL); Steve Jones, Northumberland (GB); Andrew Kelley, Tyne & Wear (GB)

(73) Assignee: Viasystems Group, Inc., St. Louis, MO (US)

( * ) Notice: Subject to any disclaimer, the term of this patent is extended or adjusted under 35 U.S.C. 154(b) by 70 days.

(21) Appl. No.: 09/711,366

(22) Filed: Nov. 10, 2000

(51) Int. Cl.$^7$ ............................... G06F 17/50
(52) U.S. Cl. ............... 716/20; 716/19; 430/30
(58) Field of Search ................. 716/20, 19, 15, 716/10; 430/30, 320, 311; 382/141, 145, 151; 702/85, 94, 95; 408/1 R (56) References Cited

U.S. PATENT DOCUMENTS

| | | | |
|---|---|---|---|
| 4,799,175 A | | 1/1989 | Sano et al. .............. 364/552 |
| 4,890,239 A | | 12/1989 | Ausschnitt et al. ......... 364/491 |
| 4,967,381 A | | 10/1990 | Lane et al. ............ 364/551.01 |
| 5,134,664 A | * | 7/1992 | Clough et al. ................ 382/8 |
| 5,206,820 A | | 4/1993 | Ammann et al. .......... 364/559 |
| 5,495,535 A | * | 2/1996 | Smilansky et al. ......... 382/145 |
| 5,497,331 A | * | 3/1996 | Iriki et al. .................. 364/468 |
| 5,519,633 A | | 5/1996 | Chang et al. ............... 364/491 |
| 5,828,573 A | * | 10/1998 | Hayashi ................. 364/468.28 |
| 5,862,517 A | * | 1/1999 | Honey et al. ................. 702/85 |
| 5,960,185 A | * | 9/1999 | Nguyen .................... 395/500.1 |
| 5,965,306 A | | 10/1999 | Mansfield et al. ............ 430/22 |
| 6,030,154 A | * | 2/2000 | Whitcomb et al. ......... 408/1 R |
| 6,070,004 A | * | 5/2000 | Prein ..................... 395/500.11 |
| 6,165,658 A | * | 12/2000 | Taff et al. ..................... 430/30 |

\* cited by examiner

*Primary Examiner*—Vuthe Siek
(74) *Attorney, Agent, or Firm*—Dunlap, Codding & Rogers, P.C.

(57) ABSTRACT

Targets are inserted throughout the layout of a PCB. Post manufacture measurement of the targets are compared to pre-manufacture positions so as to calculate a non-linear regression analysis best fit model. This model is used to predict a feature's location upon or within a PCB given the feature's position on the layout. The non-linear regression analysis results in a set of x and y polynomial equations. These polynomial equations allows for a linear compensation to be applied to the feature position on a layout so as to minimize misregistration of features in the manufacture of PCBs. Models of the features' post production positioning is made before and after linear compensations are made to the pre-manufacture positioning of the features. Graphical presentations using wire frame diagrams and color coded diagrams help identify those areas of the panel that are projected to be in and out of tolerance relative to the specifications.

70 Claims, 5 Drawing Sheets

SYSTEM AND METHOD FOR MONITORING AND IMPROVING DIMENSIONAL STABILITY AND REGISTRATION ACCURACY OF MULTI-LAYER PCB MANUFACTURE

FIELD OF THE INVENTION

This present invention relates generally to the manufacture of printed circuit boards. More particularly this system relates to the measurement and analysis of printed circuit board distortions encountered during production and compensating for such distortions.

BACKGROUND TO THE INVENTION

The manufacture of printed circuit boards (PCBs) involves a succession of processing steps, some of which convert a circuit design of multiple layers to images, patterns, or circuits that will be transposed to a base material for subsequent processing into electrical interconnections. The design may be directly imposed on a production medium or on a drawing or graphical representation medium. Most usually the design is converted to a digital data representation. Conversion to a digital data representation may be accomplished with commercially available Computer Aided Design (CAD) software. The CAD program, in concert with a computer aided manufacture (CAM) program, translates the design data to a "layout" of a series of items such as circuits, interconnection holes and solder masks to be placed on the base material panel. The layout is usually transposed to a medium called artwork although the layout may also be directly transposed via a laser. The items are referred to as features. Ultimately, sections of the panel will be combined to make a PCB which in many cases are multi-layered.

Features can be applied via a photographic process onto the base material panel using an artwork or directly imaged e.g. laser imaging. During manufacture, dimensional changes of the base material will cause a difference between the anticipated location of a feature and the actual location of that feature. Spacing of a feature is particularly important so as to not short out or interfere with adjacent circuits. Further when the feature is an interconnection hole on a multi-layered circuit board, it is particularly important that these holes be aligned correctly with features in layers above or below. The location of the feature or hole relative to others is known as its "registration". If there are misregistrations on the circuit board then subsequent processes such as drilling and further imaging operations may potentially result in misalignments with those further features. In instances of gross misregistration, the resulting product will be out of tolerance and scrapped. Often elements are placed on the panel with special marker information or easily recognizable design so as to easily measure movement that occur in the manufacturing process. These elements will be referred to as "targets".

Correction of errors in manufacture has been the subject of much development. For example, U.S. Pat. No. 4,890,239 to Ausschnitt, et al. was issued for a "Lithographic Process Analysis and Control System." This system is a system and method for modelling the necessary focus and exposure required when one is imaging features of particular dimensions. The system has ramifications for PCB manufacture, however it does not deal with how to measure the distortion of PCB material and how to correct that distortion.

U.S. Pat. No. 4,799,175 to Sano, et al. was issued for a "System for Inspecting Pattern Defects of Printed Wiring Boards." The invention comprises very specific equipment for measuring PCB defects for characterizing the quality of resultant PCBs using targets on the PCB. There is no mention of how to correct for the errors that are present.

U.S. Pat. No. 4,967,381 was issued to Lane, et al. for a "Process Control Interface System for Managing Measurement Data." This invention is a system for obtaining measurement data for process control and trend analysis purposes. While data can be taken using this invention, the corrective action required is not disclosed.

U.S. Pat. No. 5,206,820 to Ammann, et al. was issued for a "Metrology System for Analyzing Panel Misregistration in a Panel Manufacturing Process and Providing Appropriate Information for Adjusting Panel Manufacturing Processes." This patent describes the process of creating targets known as "fiducials" on a glass master. The targets are placed in the corner of the master and are subsequently measured. Errors are characterized for any particular phase of the manufacturing process and monitored so that the contribution of the various errors can be reduced as much as possible. Targets are not placed throughout the PCB panel and thus might miss certain types of distortion. Further, corrective action is not discussed.

U.S. Pat. No. 5,495,535 to Smilansky, et al. was issued for a "Method of Inspecting Articles." This system has the goal of inspecting articles and detecting errors for subsequent monitoring of a process which might also include PCB manufacture. The system stores points and compares the stored points to the actual points. Corrective action is not described however.

U.S. Pat. No. 5,519,633 was issued to Chang, et al. for a "Method and Apparatus for the Cross-Sectional Design of Multi-Layer Printed Circuit Boards." This invention relates to the design and manufacture of circuit boards and does attempt to minimize errors associated with the manufacturing. The tracking of such errors via targets of different types is not discussed.

U.S. Pat. No. 5,497,331 was issued to Iriki, et al. for a "Semiconductor Integrated Circuit Device Fabrication Method and Its Fabrication Apparatus." This invention is designed to enhance the yield of integrated circuit devices. No targets are used during the course of this particular invention or the equipment associated therewith.

U.S. Pat. No. 6,070,004 to Prein was issued for a "Method of Maximizing Chip Yield for Semiconductor Wafers." Again, this is an invention that relates to integrated circuit design. It is designed to maximize chip yield over an entire wafer. However, there are no targets involved in the process nor is there an attempt to model any systematic errors introduced during the manufacturing process.

U.S. Pat. No. 5,960,185 was issued to Nguyen for a "Method and Apparatus for Wafer Disposition Based On Systematic Error Modelling." This system relates to integrated circuits and for modelling the errors that are systematic and might be introduced during the course of integrated circuit manufacture. However, this system models various error sources that relate to the positioning of a mask and not to the migration of the material itself. Thus, this patent relates principally to mask alignment and errors based on a known library of errors that can occur with mask alignment. There are no targets involved in the process, nor is material migration dealt with in any fashion.

U.S. Pat. No. 6,030,154 was issued to Whitcomb, et al. for a "Minimum Error Algorithm/Program." This patent relates to multi-layer printed circuit boards and for minimizing the error associated with drilling holes to connect the circuits of one layer with another. The system involves taking x-rays of the various layers and determining the optimum location for drilling between layers. While this process does involve trying to compensate for errors in material movement, there is no attempt to measure the material movement in any systematic way for the purpose of minimizing the errors during subsequent manufacture.

In the manufacture of PCBs, in order to reduce build up of positional errors during manufacture, each process requiring registration of an image to the product must apply compensations to the image positioning of the features to allow for the material movement. Compensations are determined by historical data of compensations required for similar product or by producing a small run of boards to determine the compensations required. To monitor and control the manufacturing processes, measurements are taken of feature and target positions during production. These measurements are compared with the specifications.

As noted above current methods of measurement use targets located in the corners of the panel or artwork and base compensation calculations on the difference in pitch between the measured targets and the required separations or pitch.

Material movement occurs due to changes of temperature, humidity, relaxation of stresses within the materials and stress introduction due to process interactions. The extent of movement varies according to the materials used and the design of the circuitry being manufactured. Printed circuit board manufacture requires numerous processes that will cause changes in temperature and humidity such as thermal curing or chemical treatment. Material movement also occurs when the product is subjected to a mechanical process such as bonding or brushing.

To ensure that the final product meets the customer's requirements, image compensation is applied to offset dimensional changes that occur. This is done in the form of a stretch or shrink to the data that is used to generate artworks used for inner and outer layer manufacturing. The initial drill program may be also compensated.

Photo tools used for imaging processes are key to maintaining the registration, that is, the relationship of one layer of a multi-layer PCB to another layer. For this reason the pitch between targets is measured on artwork or other image transfer medium to ensure the correct compensations have been applied before the PCB is placed into production.

Once linear distortions and material migration has been accounted for, PCBs are inspected at key points during manufacture to check that the compensations have worked and in cases of prototyping to determine the compensations to apply for volume manufacture.

Current systems use non-contact measuring machines to measure the pitch between targets located in the four corners of the panel and compare these to a nominal value to calculate a compensation value. Initial compensations for new designs are determined based upon similarity of the materials and design to previously manufactured panels.

The problem with this system is that it does not take into account non-linear distortion. The measurement of targets in the corners may indicate the panel/artwork to be dimensionally correct, but in fact a non-linear distortion may have caused features between the corners, that is within the panel, to have moved significantly. Different materials will behave in different ways when put through the same processes and alternative processes will affect the same material in different ways.

As printed circuit designs are moving towards higher densities of smaller features, material distortion and registration accuracy have a more significant effect on final yields. Manufacturers are looking to new materials and methods to give greater control over registration accuracy.

What is therefore required is a system for measuring and characterizing the dimensional stability of different materials and designs and the material movement caused by the PCB manufacturing processes. Such a system would use multiple targets throughout a PCB manufacturing panel to create an index of non-linear material movement. The movement of these targets would then be mathematically modelled so that an inverse of the distortion can be created in the original data that gives rise to the artwork.

SUMMARY OF THE INVENTION

It is therefore an objective of the present invention to improve registration capability in the manufacture of multi-layer printed circuit boards.

It is therefore an objective of the present invention to improve registration capability in the manufacture of printed circuit boards.

It is a further objective of this method to characterize the material movement and distortion of both product and related layout caused by the manufacturing processes.

It is still another objective of the present invention to be able to view and characterize the distortions relating to material movement during the PCB manufacturing process.

It is a further objective of the present invention to modify the positioning of features so as to compensate for errors introduced in the production process.

It is a further objective of the present invention to modify the digital representation of the positioning of features so as to compensate for errors introduced in the production process.

It is yet another objective of the present invention to be able to mathematically characterize the distortion relating to material movement in PCB production.

It is still another objective of the present invention to insert targets in the layout design for subsequent transfer to the PCB manufacturing panel to allow distortions to be measured.

It is a further objective of the present invention to insert targets in the layout design for subsequent transfer to the PCB manufacturing panel along periphery of the manufacturing panel to allow distortions to be measured.

It is yet another objective of the present invention to model movement of PCB material during production.

It is still another objective of the present invention to measure material movement that occurs within the bounds of a PCB.

It is a further objective of the present invention to measure the movement of PCB material around the periphery of the PCB.

It is a further objective of the present invention to reduce scrap during PCB manufacture.

It is yet another objective of the present invention to increase the capability of PCB manufacture.

It is still another objective of the present invention to measure the dimensional stability of different materials that are used in the PCB process.

It is a further objective of the present invention to manufacture PCB within narrow tolerances throughout a large piece of multi-layer material.

Using the method of the present invention, targets are added to the CAD/CAM data of each layer of the PCB features on the manufacturing panel. The CAD/CAM, or equivalent tool, inserts easily recognizable targets in the layout of each layer that will produce the PCB manufacturing panel. Targets placement can be around the periphery, across the entire PCB manufacturing panel or both. The targets are inspected using non-contact, non-intrusive video or x-ray co-ordinate measuring machines at any required stage of manufacture to determine the actual position in two dimensions from a predetermined location (a nominated center of origin). Selection of a universal center of origin is arbitrary and may, for example, be the midpoint of two targets.

The actual positions and nominal positions are used to calculate the deviations. In once embodiment a regression analysis is applied to the deviation values to produce, for this embodiment, two polynomial equations determined by best fitting the deviations from nominal of any location upon any of the layers.

Linear compensation values are calculated for a best fit of all points to nominal. A graphical representation of the effects of applying these compensations is generated using the calculated polynomial equation. A model is also generated showing the areas of the panel capable of achieving the required positional registration tolerances with and without application of the calculated compensations.

The best feature to feature positional registration achievable with and without the calculated compensations is determined. Values are generated for overall rotation, offset in two dimensions, coefficients of distortion parallel to the axes of the panel and rhombic distortion.

This method gives both a graphical and numeric interpretation of material movement allowing comparison of different materials. It also allows an understanding of the effects of a manufacturing process upon the PCB material being used. Thus the system and method of the present invention permits new processes to be characterized. Further, the method of the present invention provides real time dimensional analysis to allow re-scaling of tooling to fit product and prevent out of tolerance or scrap product at the earliest possible stage of manufacture. Use of the method described and claimed herein, to modify feature positioning so as to compensate for the modelled non-linear distortions and checking the production results for out of tolerance conditions, ensures that misregistration and scrap are minimized.

BRIEF DESCRIPTION OF THE DRAWINGS

FIG. 6 illustrates a flow diagram of the analysis method of the present invention.

DETAILED DESCRIPTION OF THE INVENTION

Figure 1:
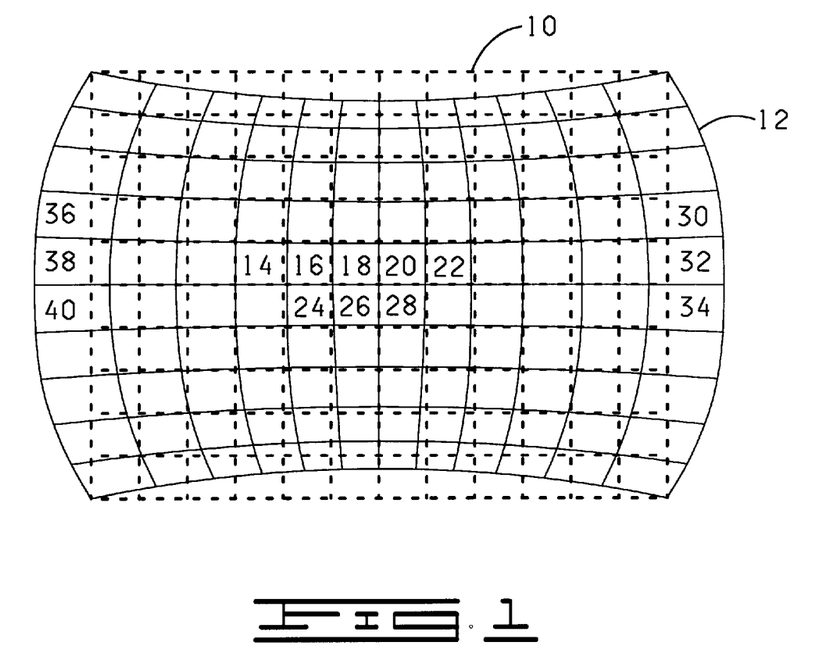
FIG. 1 illustrates a schematic of non-linear distortion.

FIG. 1 illustrates a typical non-linear distortion of PCB substrate that may occur during the manufacturing process. The nominal and desired location of the PCB material is represented by grid 10. This grid represents the desired location of the PCB material and associated interconnection features pre-production. However, and as noted above, the PCB material undergoes changes in its location and distortion during the production process. Thus interconnection features such as holes on the PCB at locations 14, 16, 18, 20, 22, 24, 26, and 28 may all be within the desired positional specification relative to the design layout for the production of a PCB with low tolerance for errors. However, the same features located at PCB location 30, 32, 34, 36, 38, and 40 would be out of tolerance relative to the design layout (image) and thus the PCB would be scrapped resulting in low production yields.

The entire, non-linear distortion for FIG. 1 is thus illustrated as grid 12. It is important to note however, that if one were to place targets and measure only in the corners of the PCB material, the PCB would appear to be within specification when in fact the location of the interconnection features, such as holes, in the majority of other grid 10 locations would be out of tolerance. Only by measuring many positions on the PCB material can the true distortion be assessed and hence compensated for.

Figure 2:
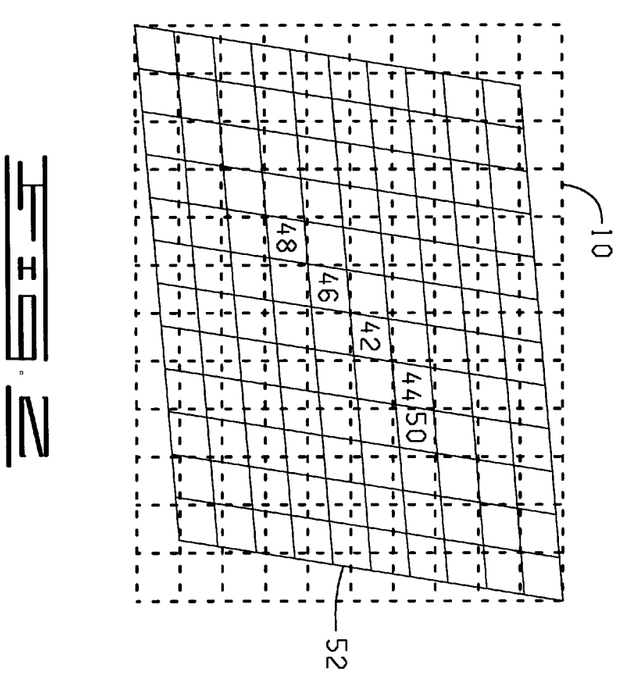
FIG. 2 illustrates is a schematic of rhombic distortion.

Referring to FIG. 2 another type of distortion is illustrated. In this instance rhombic distortion is illustrated. Again grid 10 illustrates the desired location of the finished PCB material and associated circuitry. In this case shrinkage and distortion of the PCB material during manufacture results in some locations being within spec such as those at location 42, 44, 46, 48, and 50. However, given the distortion present, the majority of the PCBs would be out of spec. Again resulting a large amount of scrap and low yield for the process.

In this instance grid 52 represents the PCB material post-production. If measurements for distortion were only made at the location 44, and 46, no distortion would be detected when in fact most of the PCB material would be out of spec.

Thus it is important to have a system and method that detects the various linear and non-linear distortions that can exist during the PCB manufacturing process.

Figure 3:
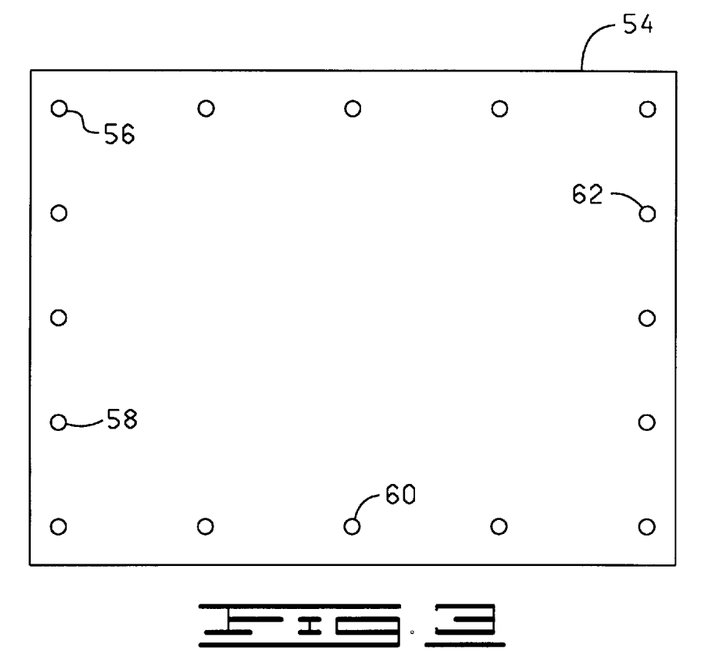
FIG. 3 illustrates a schematic of measurement targets located around the periphery of the panel in accordance with one embodiment.
Figure 4:
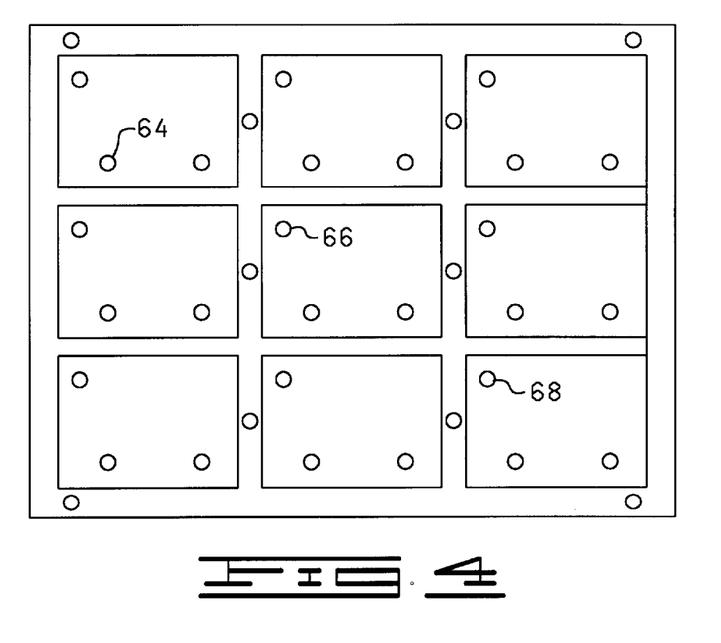
FIG. 4 illustrates a schematic of measurement targets distributed across the whole panel in accordance with one embodiment.

Increasing the number of points measured will give more information regarding the PCB material movement. For purposes of this application the term "fiducials" is used to designate targets that are added outside of the actual circuit design features desired. Circuit design features may also serve as targets for the analysis of the present invention such features need only be distinct (for precision of measurement) and have known pre-production location to serve as measurement points in much the same manner as fiducials. FIGS. 3 and 4 show how targets can be added to the part being measured. As noted above, features may serve as targets and fiducials may also serve as targets. For example, targets in FIG. 4 that are within the bounds of the panel may well be features that were in the original circuit design. Whereas the perimeter targets or fiducials would not serve any function other than to facilitate distortion measurements. Thus, for purposes of this description, "target" is meant to include either a design feature or a fiducial.

In general, the greater the number of targets used, the greater the accuracy. However, there is some optimum number or density of targets beyond which there are diminishing returns. The optimum is a function of the material used, the complexity and density of the PCB and the mechanical, thermal, chemical and ambient conditions encountered in manufacture as well as other conditions.

This optimum number of targets may initially be determined experimentally. Initially, a large number of targets in the analysis can be used. Then, experimentally, targets are removed one at a time, from the analyses until the accuracy deteriorates. Reducing the number of targets improves analysis time.

Characterization of the material movement of the PCB panel material and the features requires measurement of the deviation of the targets from their nominal position. The deviation of the targets from their nominal to their actual position on the PCB panel is input for a regression analysis. This preferred embodiment uses curve fitting for best fit to derive two polynomial equations.

These equations are used to model material movement and deviation in each axis (X, Y) for any location on the PCB.

Referring to FIG. 3 the placement of targets around the periphery of the initial artwork is illustrated. In this instance artwork 54 comprises a series of targets 56, 58, 60, and 62 are placed around the periphery of the artwork from which PCBs will be made. By having targets around the periphery, errors such as the type depicted in FIG. 1 can be detected even when the corners of the material are in the correct location. Using a target scheme suggested in FIG. 3, non-linear distortions not detectable with targets placed in the corners would be detected. Thus allowing for compensations that would not otherwise be made. Further, when the final PCBs are manufactured, if there are additional targets, it is more likely that out of specification conditions would be detected earlier in the production cycle, thus limiting the amount of scrap.

Referring now to FIG. 4 alternative placement of targets throughout the PCB. For artworks and external circuit features measurements are taken using a video based non-contact co-ordinate measuring machine. For targets internal to the board an x-ray based non-contact co-ordinate measuring machine is used.

Figure 5:
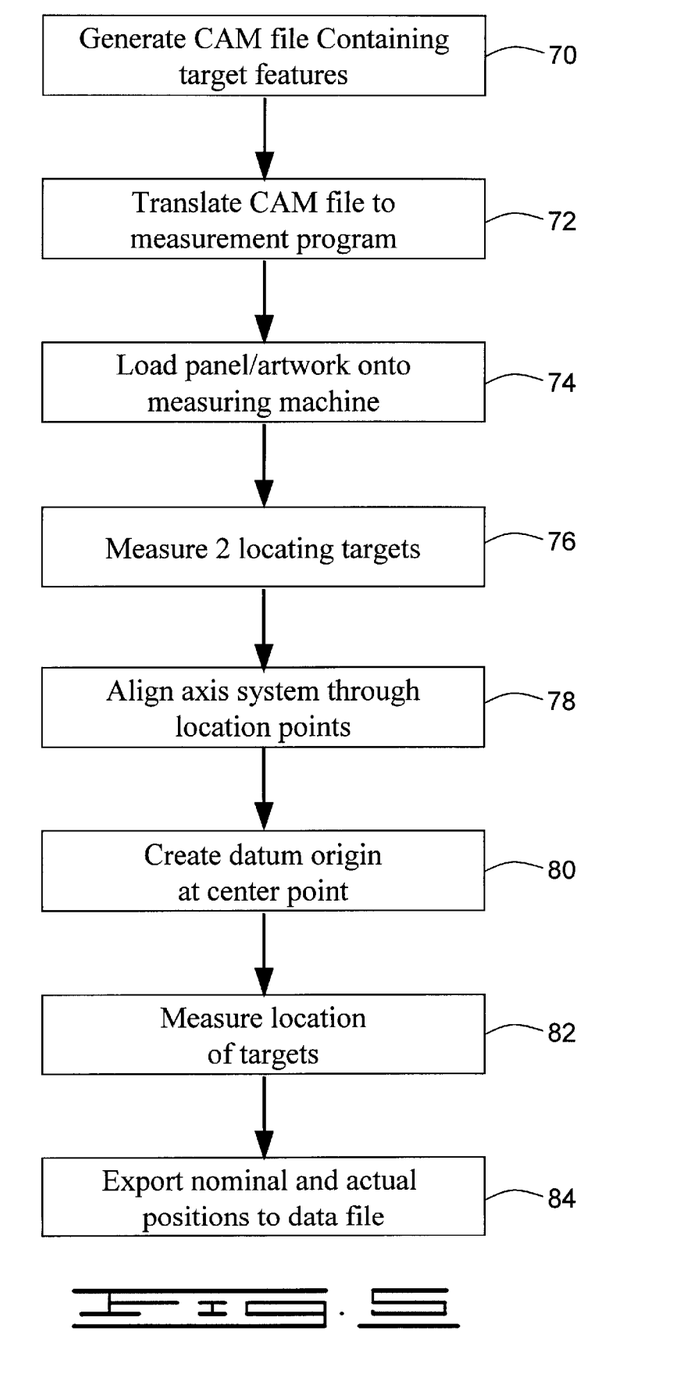
FIG. 5 illustrates a flow diagram of the measurement procedure of the present invention.

FIG. 5 illustrates a flow diagram of the measurement procedure for one embodiment of the present invention. A CAM file is first generated which contains the targets and or target features 70. The CAM files is then translated to the measurement program 72. The panel and or artwork is then loaded into a measuring machine for determining target locations 74. Two targets are selected and measured 76 and a point of origin (center of origin) is generated, for instance, at the midpoint between two targets. The axis system is aligned to this for the measurements 78. The point of origin is designated 80. Each target is given an x and y co-ordinate relating its nominal location to the center of origin. The nominal and actual position of the targets is then exported to a data file 84. After manufacture the actual locations of the targets from the origin position are measured and the results are stored in a data file, along with the nominal co-ordinates. The analytical software will access this data file. If a sample of panels is being measured then the process is repeated for each panel and the results are appended to the data file.

FIG. 6 illustrates a flow chart of the analysis method of one embodiment of the present invention. The results from the data file, (i.e. the nominal target coordinates 86 and the actual target coordinates 88) are imported by analysis software. The deviations in the x and y axes are calculated for each measured point 90. A non-linear regression analysis is performed on these results 92 to determine two polynomial equations, one for x deviation and one for y deviation, according to each point's location on the panel.

Once the non-linear regression model is determined, a linear regression is performed to generate linear compensation factors in each axis, offset from the origin and for panel rotation. A distortion model of the post manufacture locations, using the polynomial equations, is made 96 assuming the linear regression compensations were applied to the pre-manufacture layout. The best achievable registration is determined 100 from a model that assumes a linear regression compensation has been made and from a model where there have been no compensations applied. Areas of the panel capable of achieving required registration tolerances is derived from the model 102.

A graphical presentation in the form of wire frame diagram of the panel is generated using the polynomial equations derived from the non-linear regression. A second wire frame diagram is generated using the non-linear analysis results to display the effects of applying the calculated linear compensations. The user can adjust this diagram to remove the effects of measured offsets and rotation.

Figure 7:
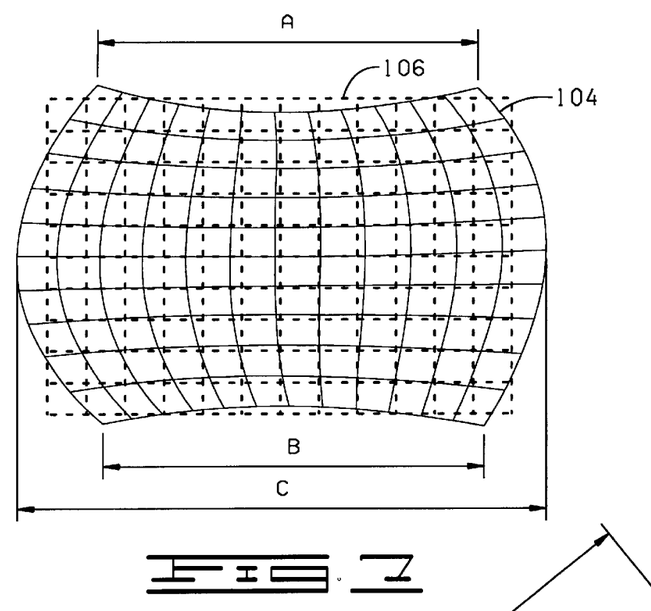
FIG. 7 illustrates a schematic showing the compensation for axial distortion factors.

FIG. 7 illustrates such wire frame diagram. In this instance, FIG. 7 illustrates a schematic showing the requirement for calculation of axial distortion factors. Compare FIG. 7 with FIG. 1. The solid wire frame 104 is 'best fitted' to the theoretically perfect dotted wire frame 106. Note that the fit in FIG. 7, which uses a non-linear regression model to effect compensation, is a superior to the fit in FIG. 1.

Figure 8:
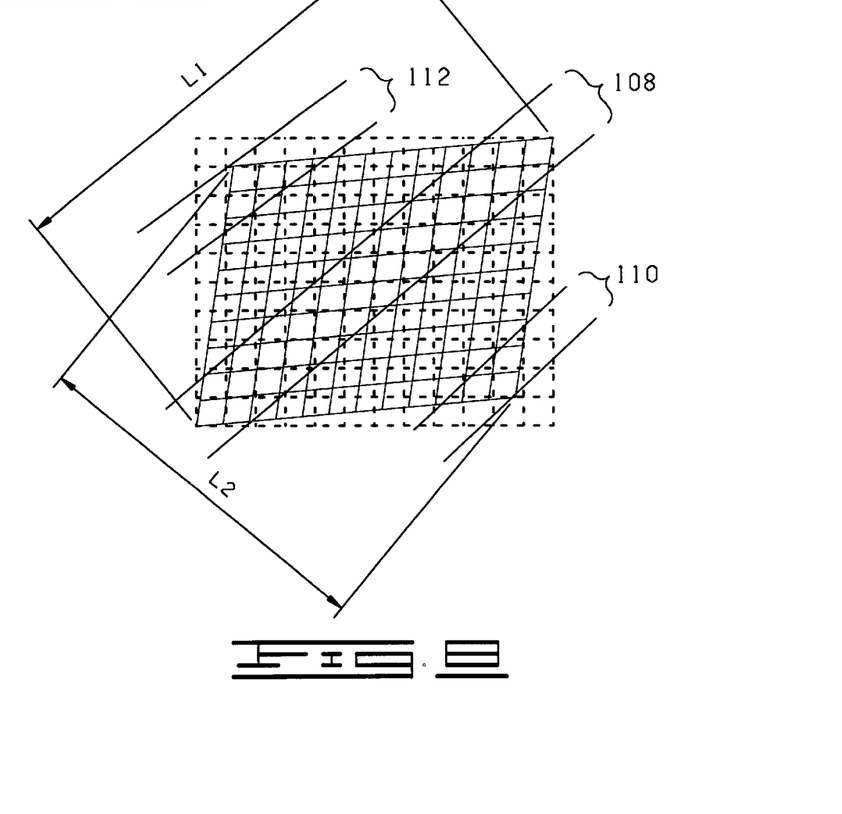
FIG. 8 illustrates a schematic showing the compensation for rhombic distortion factors.

FIG. 8 illustrates a schematic showing the requirement for calculation of rhombic distortion factors.

A graphic representation of the panel shows the areas of the measured panel that a user entered where minimum registration tolerance can be achieved based upon the x and y co-ordinates about the origin where the deviation calculated by the non-linear polynomials is less than the required tolerance. The areas capable of achieving the tolerance L1 and L2 further have zones 108, 110, and 112 where tolerances can be met. Other areas would be out of tolerance. A second diagram graphically portraying in and out of tolerance conditions may be generated where effects of offset and rotation are ignored.

One embodiment uses color coding to highlight achieving tolerance (green) and being out of tolerance (red). Use of green and red are not meant to be limiting. Other acceptable and unacceptable color combinations may be used.

Based upon these measurements and observations, it is now possible to create CAD/CAM data and/or original master artwork that contain the inverse of the errors encountered during the initial measurement process. In so doing, the distortions that will occur during the PCB manufacturing process will still occur, but instead will result in the material and features migrating to correct, in tolerance locations.

Additionally this system and method can be used during production. The targets would be monitored and the target locations would be charted. The production locations then could be compared to the regression model's predicted location. As the actual locations deviate from the expected locations beyond certain bounds, the regression analysis would be recalculated. Compensations would be modified thus modifying the fabrication tooling so as to adjust for the change from expected material movement.

The apparatus of the present invention comprises an assembly of hardware and software. For example, generating computer aided manufacturing (CAM) fields may be accomplished using the Genesis® CAM software product available from Frontline, Inc. CAD CAM software from Router solutions may be used to translate CAM files to the measurement function of the present invention. Sources for measurement equipment used for the present invention includes Videomic, Optek, Inc, Innervision, Optek, Inc., and Smartscope, Optical Gauging Products, Inc.

A system and method for monitoring and improving dimensional stability and registration accuracy of multi-layer PCB manufacture has now been illustrated. It will be apparent to those skilled in the art that other variation in target location and mathematical analysis will be possible without departing from the scope of the invention as disclosed.

We claim:

1. A method for accurate positioning and registering features on a printed circuit board (PCB) panel comprising:
   creating a layout having corners for positioning features on at least one base material panel;
   positioning a plurality of targets on the layout at desired positions;
   recording the pre-manufacture nominal position of each target;
   manufacturing at least one PCB from the at least one base material panel;
   measuring the post manufacture actual position of each target;
   recording the actual position of each target;
   calculating a movement of the actual position of each target from the nominal position of each target;
   modeling the movement of the plurality of targets during manufacture by analyzing the target movement to develop a best fit non-linear regression analysis; and
   applying the model to the pre-manufacture feature positions to compensate for the movement during the manufacture.

2. The method of claim 1 wherein the layout is in the form of artwork.

3. The method of claim 2 wherein creating artwork, positioning features, and positioning targets for measurement comprises creating the artwork using a Computer Aided Design program.

4. The method of claim 1 wherein recording the pre-manufacture nominal position of each target comprises:
   establishing the pre-manufacture center of origin for all targets as a point within the layout;
   assigning the nominal position of each target as horizontal and vertical coordinates relative to the center of origin; and
   storing the nominal position of each target's horizontal and vertical coordinates for subsequent calculating post-manufacture movement.

5. The method of claim 4 wherein the calculating the post-manufacture actual position movement of each target comprises:
   measuring the actual post-manufacture position of each target as horizontal and vertical coordinates relative to the pre-manufacture center of origin; and
   computing each target's horizontal coordinate movement as the difference between the target's actual horizontal coordinate and the target's nominal horizontal coordinate; and
   computing each target's vertical coordinate movement as the difference between the target's actual vertical coordinate and the target's nominal vertical coordinate.

6. The method of claim 1 wherein positioning the plurality of targets for measurement comprises positioning targets at the corners of the layout.

7. The method of claim 1 wherein positioning the plurality of targets for measurement includes positioning targets around the periphery of the layout.

8. The method of claim 1 wherein the plurality of targets comprise features.

9. The method of claim 1 wherein the measuring of post-manufacture actual positions comprises non-intrusive measurement.

10. The method of claim 9 wherein the non-intrusive measurement is accomplished by non-contact video co-ordinate measuring machines for external PCB feature and target positions.

11. The method of claim 9 wherein the non-intrusive measurement is accomplished by x-ray co-ordinate measuring machines for internal PCB feature and target positions.

12. The method of claim 1 further comprising representing a projected actual position of features in a graphical form.

13. The method of claim 12 wherein the representing the projected actual position of features in a graphical form comprises representing the position of features with a wire frame diagram.

14. The method of claim 1 further comprising:
   measuring the position of the targets on the layout; and
   assessing the movement of the plurality of targets from the desired position on the layout.

15. The method of claim 14 further comprising:
   compensating the placement of features on the layout for offsetting the affects of distortion due to creating the layout from the design.

16. The method of claim 14 wherein the measuring of the position of the targets on the layout is done in a non-intrusive manner.

17. The method of claim 16 wherein the measuring of the position of the targets on the layout is done in a non-intrusive manner comprises non-contact video co-ordinate measuring.

18. A printed circuit board (PCB) with accurate layer registration produced by the process of claim 1.

19. A method for accurate positioning and registering features on a printed circuit board (PCB) panel comprising:
   creating a layout having corners for positioning features on at least one base material panel;
   positioning a plurality of targets on the layout at desired positions;
   recording the pre-manufacture nominal position of each target, wherein recording the pre-manufacture nominal position of each target comprises:
     establishing the pre-manufacture center of origin for all targets as a point within the layout;
     assigning the nominal position of each target as horizontal and vertical coordinates relative to the center of origin; and
     storing the nominal position of each target's horizontal and vertical coordinates for subsequent calculating post-manufacture movement;
   manufacturing at least one PCB from the at least one base material panel;
   measuring the post manufacture actual position of each target;
   recording the actual position of each target;
   calculating a movement of the actual position of each target from the nominal position of each target by:
     measuring the actual post-manufacture position of each target as horizontal and vertical coordinates relative to the pre-manufacture center of origin;
     computing each target's horizontal coordinate movement as the difference between the target's actual horizontal coordinate and the target's nominal horizontal coordinate; and computing each target's vertical coordinate movement as the difference between the target's actual vertical coordinate and the target's nominal vertical coordinate;

modeling the movement of the plurality of targets during manufacture by analyzing the target movement to develop a best fit non-linear regression analysis; and applying the model to the pre-manufacture feature positions to compensate for the movement during the manufacture.

20. The method of claim 19 wherein analyzing the best fit non-linear regression analysis comprises generating at least one polynomial equations whereby the projected non-linear position for any feature on the at least one base material panel is a function of the feature's nominal position on the layout.

21. The method of claim 20 wherein the analyzing the best fit non-linear regression analysis comprises generating a polynomial equation for predicting each feature's post-manufacture horizontal position on a panel; and, generating a separate polynomial equation for predicting each feature's post-manufacture vertical position on a panel based upon each feature's nominal vertical and horizontal coordinates on the layout.

22. The method of claim 19 further comprising applying linear regression analysis to generate linear compensation factors for features in horizontal and vertical axes, offset from the origin and offset for panel rotation.

23. The method of claim 22 wherein applying the linear regression analysis is accomplished by positioning features by offsetting the horizontal and vertical coordinates of the features by a linear factor to compensate for the movement introduced during the manufacture.

24. The method of claim 23 further comprising applying a rotational deviation factor to compensate for the movement introduced during the manufacture.

25. The method of claim 23 further comprising applying a rhomboidal deviation factor to compensate for movement introduced during the manufacture.

26. The method of claim 19 further comprising representing the projected actual position of features in a graphical form.

27. The method of claim 26 wherein the representing a projected actual position of features in a graphical form comprises representing the position of features with a wire frame diagram.

28. The method of claim 27 further comprising applying a linear compensation to each feature position on the layout before representing the projected actual position of features in a graphical form with a wire frame diagram.

29. The method of claim 19 further comprising: modeling a predicted actual position for each feature; and presenting a color coordinated graphical representation that depicts a feature's anticipated position as being out of tolerance with one color and that depicts a feature's anticipated position as being within tolerance with a second color.

30. The method of claim 29 wherein the color green is used to represent feature placement within tolerance and the color red is used to represent feature placement that is out of tolerance.

31. The method of claim 29 further comprising applying a linear compensation to each feature's position on the layout prior to modeling the anticipated actual position of each feature using a non-linear regression model.

32. The method of claim 31 wherein the color green is used to represent projected feature positions that are within tolerance and the color red is used to represent feature projected feature positions that are out of tolerance.

33. The method of claim 19 further comprising:

calculating the minimum registration error achievable using a non-linear regression analysis; and producing the PCB if the minimum registration error is within a predetermined tolerance.

34. The method of claim 19 further comprising applying linear compensations to feature positioning to correct misregistration projected by the non-linear regression analysis;

applying the non-linear regression analysis after applying the linear compensation;

calculating a minimum registration error achievable; and producing the PCB if the minimum registration error is within the predetermined tolerance.

35. The method of claim 19 further comprising: modeling the post-production actual position the targets whose nominal positions have been adjusted in the layout so as to compensate for material movement due to manufacture; measuring the post-production actual position of targets whose nominal positions have been so adjusted; comparing the post-production measured actual position of targets with the modeled post manufacture target positions; and adjusting the layout so as to further compensate feature layout positions as measured by the movement of the plurality of targets, whereby the positioning of features will reduce out of tolerance conditions and misregistration that might otherwise have occurred without further compensation.

36. The method of claim 19 wherein PCBs are of differing base materials are manufactured and the non-linear regression analysis made such that the effects of using alternative materials can be assessed with respect to registration accuracy.

37. A printed circuit board (PCB) with accurate layer registration produced by the process of claim 19.

38. A system for accurate positioning and registering features on a PCB panel comprising:

means for producing a layout having corners for positioning features on at least one base material panel;

means for positioning a plurality of targets on the layout at desired positions, said targets being dispersed throughout the at least one base material panel;

means for recording the pre-manufacture nominal position of each target;

means for manufacturing at least one PCB from the at least one base material panel;

means for measuring the post-manufacture actual position of each target;

means for recording the actual position of each target;

means for calculating the movement of the actual position of each target from the nominal position of each target;

means for modeling the movement of the plurality of targets introduced during manufacture by developing a best fit non-linear regression analysis using the nominal coordinates of each target on the layout as the basis for modeling each target's post manufacture coordinates on the one or more base material panels; and means for optimizing the position of features by compensating features' locations in the layout so as to compensate for the movement introduced in manufacture of the at least one PCB.

39. The system of claim 38 wherein the layout is in the form of artwork.

40. The system of claim 39 further comprising CAD/CAM instructions for creating the artwork, for positioning features and targets.

41. The system of claim 38 wherein the plurality of targets for measurement comprises targets located at the corners of the layout.

42. The system of claim 38 wherein the plurality of targets for measurement comprises targets located around the periphery of the layout.

43. The system of claim 38 wherein the plurality of targets comprises features of the PCB.

44. The system of claim 38 wherein the means for measuring post-manufacture target actual positions is non-intrusive.

45. The system of claim 44 wherein the means for measuring post manufacture target actual positions in a non-intrusive manner comprises non-contact video co-ordinate measuring machines.

46. The system of claim 44 wherein the means for measuring post-manufacture target actual positions in a non-intrusive manner comprises x-ray co-ordinate measuring machines.

47. The system of claim 38 further comprising means for representing a projected actual position of features in a graphical form.

48. The system of claim 47 wherein the means for representing the projected actual position of features in a graphical form comprises means for generating a wire frame diagram.

49. The system of claim 38 wherein the base panel material differ from one another and further comprising means for assessing the minimum registration error according to the base panel material used so as to assess the effects of using alternative materials with respect to registration accuracy.

50. The system of claim 38 further comprising means for measuring the position of the plurality of targets on the layout so as to assess the deviations of the targets' coordinates in the layout from the plurality of targets desired positions.

51. The system of claim 50 further comprising means for compensating the placement of features on the layout so as to offset the affects of distortion due to creating the layout.

52. The system of claim 50 wherein the means for measuring the position of the targets on the layout is non-intrusive.

53. The system of claim 52 wherein the means for measuring the position of the targets on the layout in a non-intrusive manner comprises non-contact video co-ordinate measuring machines.

54. A system for accurate positioning and registering features on a PCB panel comprising:
  means for producing a layout having corners for positioning features on at least one base material panel; means for positioning a plurality of targets on the layout at desired positions, said targets being dispersed throughout the at least one base material panel;
  means for establishing the pre-manufacture center of origin for all targets as a point within the layout;
  means for assigning nominal positions for each target as horizontal and vertical coordinates relative to the center of origin;
  means for recording the coordinates for each target as the pre-manufacture nominal position of each target;
  means for manufacturing at least one PCB from the at least one base material panel;
  means for measuring the post-manufacture actual position of each target as horizontal and vertical coordinates relative to the pre-manufacture center of origin;
  means for recording the actual position of each target;
  means for calculating the movement of the actual position of each target from the nominal position of each target as the difference in the horizontal coordinate and the difference in the vertical coordinate from its center of origin coordinates;
  means for modeling the movement of the plurality of targets introduced during manufacture by developing a best fit non-linear regression analysis using the nominal coordinates of each target on the layout as the basis for modeling each target's post manufacture coordinates on the one or more base material panels; and
  means for optimizing the position of features by compensating features' locations in the layout so as to compensate for the movement introduced in manufacture of the at least one PCB.

55. The system of claim 54 wherein the best fit non-linear regression analysis further comprises at least one polynomial equation whereby a projected non-linear position for each feature on the at least one base material panel is a function of the feature's pre-manufacture nominal position on the layout.

56. The system of claim 55 wherein the best fit non-linear regression analysis results comprise:
  a first polynomial equation for projecting the feature's horizontal position on a panel and a separate polynomial equation that predicts the feature's vertical position on a panel; and,
  a second polynomial equation for projecting the feature's vertical position given the feature's nominal vertical and horizontal coordinates on the layout.

57. The system of claim 54 further comprising means for applying non-linear regression analysis for generating linear compensation factors to the horizontal and vertical coordinates of feature layout positions.

58. The system of claim 57 further comprising means for applying the linear compensation factors to feature layout positions to compensate for movement and distortion introduced in the manufacture of the at least one PCB.

59. The system of claim 58 further comprising means for applying a rotational deviation factor to the features layout position to compensate for movement and distortion introduced in the manufacture of PCBs.

60. The system of claim 58 further comprising means for applying a rhomboidal deviation and movement factor to the features layout position to compensate for movement and distortion introduced in the manufacture of PCBs.

61. The system of claim 54 further comprising:
  means for projecting an actual feature position using the best fit non-linear regression analysis; and
  means for representing the projected actual position of features in a graphical form.

62. The system of claim 61 wherein the means for representing the projected actual position of features in a graphical form is a wire frame diagram.

63. The system of claim 62 further comprising means for applying a linear compensation to feature positions on the layout before the representation of the projected actual position of features in a graphical form with a wire frame diagram.

64. The system of claim 54 further comprising:
  means for modeling the anticipated actual position for each feature; and means for creating a color coordinated graphical representation depicting each feature's anticipated placement as being out of tolerance with a first color and for depicting a feature's anticipated placement as being within tolerance with a second color.

65. The system of claim 64 wherein the second color is green and the first color is red.

66. The system of claim 64 further comprising means for applying a linear compensation to each feature's position on the layout before the projection of the anticipated actual position of each feature using a non-linear regression model is made.

67. The system of claim 66 wherein the second color is green and the first color is red.

68. The system of claim 54 further comprising:
   means for calculating the minimum registration error achievable using a non-linear regression analysis; and
   means for producing the PCB if the minimum registration error is within a predetermined tolerance.

69. The system of claim 54 further comprising:
   means for applying linear compensations to feature positioning to correct misregistration projected by the non-linear regression analysis;
   means for applying the non-linear regression analysis after applying the linear compensation;
   means for calculating a minimum registration error achievable; and,
   means for producing the PCB if the minimum registration error is within the predetermined tolerance.

70. The system of claim 54 further comprising: a model of the post manufacture actual position of the plurality of targets whose nominal positions have been adjusted in the layout so as to compensate for material movement due to manufacture;
   means for measuring the post production actual position of the plurality of targets whose nominal positions have been so adjusted;
   means for comparing the post production measured actual target positions with the modeled post manufacture target positions;
   means for further adjusting the production layout of features so as to further compensate for unexpected material movement such that the positioning of features will reduce out of tolerance conditions and misregistration that might otherwise have occurred without further compensation.

* * * * *